United States Patent
Ciubotaru et al.

(10) Patent No.: US 8,583,072 B1
(45) Date of Patent: Nov. 12, 2013

(54) MULTIPHASE LOCAL OSCILLATOR GENERATOR CIRCUIT FOR A BROADBAND TUNER DEVICE

(75) Inventors: Alexandru A. Ciubotaru, Plantation, FL (US); Jerry T. Bolton, Jr., Plantation, FL (US); Steven P. Hoggarth, Coral Springs, FL (US)

(73) Assignee: CSR Technology Inc., Sunnyvale, CA (US)

( * ) Notice: Subject to any disclaimer, the term of this patent is extended or adjusted under 35 U.S.C. 154(b) by 30 days.

(21) Appl. No.: 13/324,878

(22) Filed: Dec. 13, 2011

Related U.S. Application Data

(60) Provisional application No. 61/425,614, filed on Dec. 21, 2010.

(51) Int. Cl.
*H04B 1/16* (2006.01)
(52) U.S. Cl.
USPC ............................................ 455/318; 455/323
(58) Field of Classification Search
USPC ......... 455/313, 315, 316, 317, 318, 319, 323, 455/324
See application file for complete search history.

(56) References Cited

U.S. PATENT DOCUMENTS

| | | | | |
|---|---|---|---|---|
| 6,243,567 B1* | 6/2001 | Saito | ........................... | 455/188.2 |
| 6,856,208 B2* | 2/2005 | Lee et al. | .......................... | 331/55 |
| 7,130,604 B1* | 10/2006 | Wong et al. | ................... | 455/302 |
| 7,519,348 B2* | 4/2009 | Shah | ............................. | 455/285 |
| 8,374,570 B2* | 2/2013 | Seendripu et al. | ............ | 455/317 |
| 2006/0135108 A1* | 6/2006 | De Ranter et al. | ............ | 455/313 |
| 2007/0117530 A1* | 5/2007 | Davis | ............................ | 455/316 |

* cited by examiner

*Primary Examiner* — Blane J Jackson
(74) *Attorney, Agent, or Firm* — Fulbright & Jaworski LLP

(57) ABSTRACT

Embodiments of integrated circuits for use in a broadband tuner are described. In one embodiment, an integrated circuit includes a clock buffer configured to buffer a received clock signal and generate a buffered clock signal. Additionally, the integrated circuit includes a multiphase local oscillator core coupled to the clock buffer and configured to generate a plurality of oscillator signals in response to the buffered clock signal, each of the plurality of oscillator signals being mutually phase shifted. The integrated circuit may also include a plurality of output buffers, each configured to receive one of the plurality of oscillator signals and to produce an output signal suitable for use in a broadband tuner circuit in response to the one of the plurality of oscillator signals.

12 Claims, 11 Drawing Sheets

MULTIPHASE LOCAL OSCILLATOR GENERATOR CIRCUIT FOR A BROADBAND TUNER DEVICE

CROSS-REFERENCE TO RELATED APPLICATIONS

This application claims priority to U.S. Provisional Application No. 61/425,614 filed Dec. 21, 2010, the entire contents of which is specifically incorporated herein by reference without disclaimer.

TECHNICAL FIELD

This invention relates to broadband tuner devices and more particularly relates to embodiments of a multiphase local oscillator generator circuit for a broadband tuner device.

BACKGROUND

Modern communication systems use mixers as primary frequency-translation devices. Mixers can be either analog-multiplying-type or switching-type, and both types have found extensive use in communication receivers and transmitters. Analog multiplying mixers generally perform the straight multiplication of the inputs without generating additional components at the output. By contrast, switching mixers generate a multiplicity of components at the output typically due to the hard switching of one of the (linear) inputs by the second input; usually, only one of these components is desired and the rest are either filtered out or eliminated by other means.

In general, switching mixers are more popular than analog multipliers in integrated circuits due to their simpler design, lower noise, better dynamic range, and higher linearity. In the case of wideband systems such as receivers for digital television signals, eliminating the undesired components caused by the harmonics of the commutating local oscillator (LO) signal of the mixer is difficult to achieve by filtering only, especially at the lower end of the frequency range. For the efficient elimination of the harmonic products in these systems, harmonic rejection mixers are frequently used.

A harmonic rejection mixer typically consists of a multiphase local oscillator generator and a multiplicity of individual switching mixers followed by a scaling circuit and an output adder, as shown in the block-diagram representation of FIG. 2 where the phase accuracy of the multiphase LO generator signals is critical for the efficient suppression of the harmonic mixing products.

SUMMARY

Embodiments of integrated circuits for use in a broadband tuner are described. In one embodiment, an integrated circuit includes a clock buffer configured to buffer a received clock signal and generate a buffered clock signal. Additionally, the integrated circuit includes a multiphase local oscillator core coupled to the clock buffer and configured to generate a plurality of oscillator signals in response to the buffered clock signal, each of the plurality of oscillator signals being mutually phase shifted. The integrated circuit may also include a plurality of output buffers, each configured to receive one of the plurality of oscillator signals and to produce an output signal suitable for use in a broadband tuner circuit in response to the one of the plurality of oscillator signals.

In one embodiment, the multiphase local oscillator core includes a plurality of flip-flop devices arranged in a ring configuration. The integrated circuit may also include a plurality of isolation resistors, each isolation resistor being coupled between one of the plurality of flip-flop devices and one of the plurality of output buffers. Each of the plurality of isolation resistors may be physically positioned closer in proximity to one of the plurality of flip-flops than to one of the plurality of output buffers along a signal conducting line between the one of the plurality of flip-flops and the one of the plurality of output buffers. In a further embodiment, the plurality of isolation resistors is positioned adjacent to an output port of one of the flip-flops. Each of the plurality of isolation resistors may be configured to isolate one of the plurality of flip-flops from parasitic capacitance on the signal-conducting line between each of the plurality of flip-flops and a corresponding one of the plurality of output buffers.

In one embodiment, the clock buffer is configured to reduce spurious and harmonic anomalies in the received clock signal. The clock buffer is further configured to generate a clock signal output having a stable common-mode voltage. Additionally, the clock buffer may include a feedback control mechanism for regulating a common-mode voltage level of the clock buffer output with a reference voltage source. In a particular embodiment, the clock buffer includes a driver stage having a plurality of AC-coupled differential transistor pairs, and an output stage AC-coupled to the driver stage, wherein the output stage is configured to generate the buffered clock signal without introducing DC offsets.

In one embodiment, each of the plurality of output buffers comprises an open-loop circuit. The plurality of output buffers includes a plurality of diode-connected transistors arranged to provide control of supply voltages used to generate the output signal. Further, each of the plurality of output buffers may include a plurality of inverters arranged to buffer a differential clock signal. Also, each of the plurality of output buffers comprises a plurality of power supply rails, each power supply rail configured to supply a prescribed voltage to at least one pair of inverters arranged to buffer a differential clock signal.

A broadband tuner chip is also described. In one embodiment, the broadband tuner chip includes a harmonic rejection mixer having a multiphase local oscillator generator configured to generate a plurality of phase shifted clock signals in response to a single input clock signal received from a clock source. In one embodiment, the multiphase local oscillator generator is configured to operate at high frequencies and avoid phase errors through use of an input clock buffer coupled to a multiphase local oscillator core. The multiphase local oscillator core may be coupled to an output buffer.

In one embodiment, the multiphase local oscillator core comprises a plurality of flip-flop devices arranged in a ring configuration, the output of each of the flip-flop devices being coupled to an input of an output buffer. The broadband tuner chip may further include a plurality of isolation resistors, each isolation resistor being coupled between one of the plurality of flip-flop devices and one of the plurality of output buffers. Each of the plurality of isolation resistors may be physically positioned closer in proximity to one of the plurality of flip-flops than to one of the plurality of output buffers along a signal conducting line between the one of the plurality of flip-flops and the one of the plurality of output buffers.

In one embodiment, the output buffer comprises a plurality of inverter circuits arranged in an open-loop configuration, and having a plurality of diode-connected transistors coupled to a voltage supply rail for controlling a voltage level supplied to the plurality of inverters.

A method for providing multiphase local oscillator signals in a broadband tuner is also described. In one embodiment, the method includes receiving a clock signal, generating a buffered clock signal from the received clock signal, generating a plurality of oscillator signals in response to the buffered clock signal, each of the plurality of oscillator signals being mutually phase shifted, and buffering the plurality of oscillator signals to produce a multiphase output signal suitable for use in a broadband tuner circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
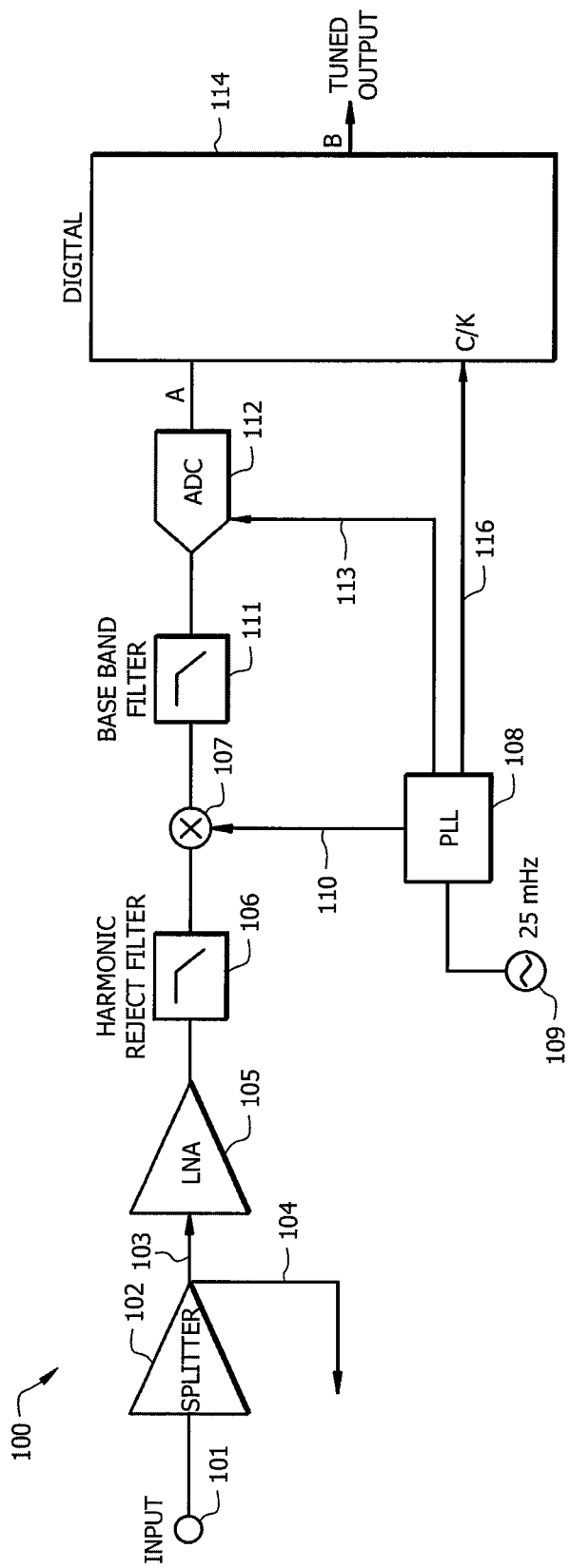
FIG. 1 is a schematic block diagram illustrating one embodiment of a tuner system.

FIG. 1 illustrates a block diagram of an overall tuner 100 system in accordance with an embodiment of the present invention. Tuner 100 is configured to receive an input signal 101, generally in the range of 50 MHz to 1 GHz, and is configured to tune to a channel signal within that frequency range. The input signal feeds into splitter 102. Splitter 102 may be embodied as a simple amplifier having multiple output signals 103 and 104. In some embodiments, output signal 104 may be sent to a second tuner, or to different processing circuitry. The main output signal 103 feeds into a low noise amplifier (LNA) 105 to amplify the signal for further processing, and is then fed into harmonic reject filter 106. Harmonic reject filter 106 may be any filter which functions to reject harmonics of the broadband signal received at input 101. In some embodiments, harmonic reject filter 106 may be implemented as a low pass filter.

The filtered signal then passes through a harmonic rejection mixer 107 which also contains harmonic rejection properties. Phase-locked loop (PLL) 108 is coupled to oscillator 109 and provides one or more clock frequencies to various blocks of tuner 100. One such clock signal 110 is used as a mixing signal, and is provided to harmonic rejection mixer 107 and is mixed with the output signal from harmonic reject filter 106. In prior art systems, mixing signal 110 may also be a source of harmonic or spurious signals occurring in the output band of interest. Thus, the present embodiments may be implemented in the harmonic rejection mixer 107 to compensate for the harmonic or spurious signals from mixing signal 110.

Embodiments of the tuner 100 may split the mixed signal into an in-phase path, I, and quadrature path, Q, for further processing, and each path may propagate separately through the next functional blocks of tuner 100. The mixed signal is then fed into baseband filter 111, and then to analog-to-digital converter (ADC) 112. ADC 112 receives clock signal 113 (in this case used as a sampling signal) from PLL 108. Sampling signal 113 may also cause undesired effects in the output band of interest. ADC 112 utilizes sampling signal 113 to convert the input signal from baseband filter 111 to a digital signal which is then input into digital block 114. The digital block 114 then produced a tuned output signal. In order to reduce errors in the tuned output signal, the harmonic rejection mixer 107 may be configured according to the embodiments described below. Such embodiments may reduce the spurious or harmonic signals introduced by the clock signal 110 generated by the PLL 108, which may be beneficial particularly at high operating frequencies.

Figure 2:
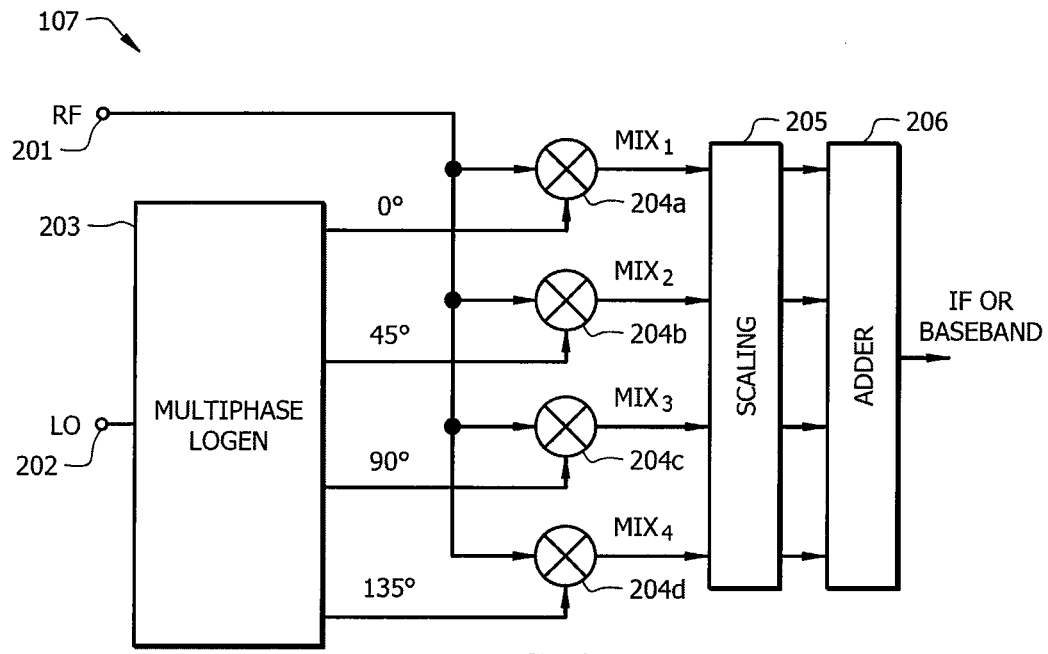
FIG. 2 is a schematic block diagram illustrating one embodiment of a harmonic rejection mixer.

FIG. 2 is a schematic block diagram illustrating one embodiment of a harmonic rejection mixer 107. The harmonic rejection mixer 107 may receive an RF signal at an RF input port 201. Additionally, the harmonic rejection mixer 107 may receive a clock signal 110 at a clock input port 202.

The clock input port 202 may be coupled to a multiphase local oscillator generator (LOGEN) 203. The multiphase LOGEN 203 may generate multiple local oscillator signals, each at an offset phases (0°, 45°, 90°, 135°) for use by passive mixing cells 204a-d. In certain embodiments, the passive mixing cells may mix the RF input signal with the regenerated phase shifted signals and pass the mixed signals to a scaling circuit 205 and/or an adder 206 to generate an output signal at an Intermediate Frequency (IF) or at a baseband frequency.

Figure 3:
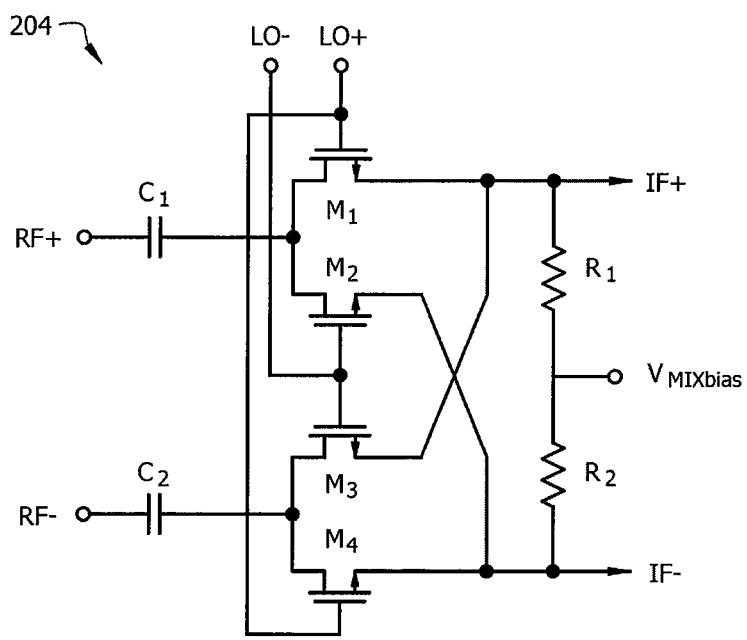
FIG. 3 is a schematic circuit diagram illustrating one embodiment of a passive mixing cell for use with embodiments of a harmonic rejection mixer.

FIG. 3 is a schematic circuit diagram illustrating one embodiment of a passive mixing cell 204 for use with embodiments of a harmonic rejection mixer 107. The depicted embodiment is a CMOS implementation of the passive mixing cell 204. The passive mixing cells 204a-d may be sensitive to harmonic or spurious anomalies in the multiphase local oscillator signals generated by the multiphase LOGEN 203. Accordingly, the embodiments of the multiphase LOGEN 203 depicted below may be used to compensate for or remove portions of such signal anomalies.

Figure 4:
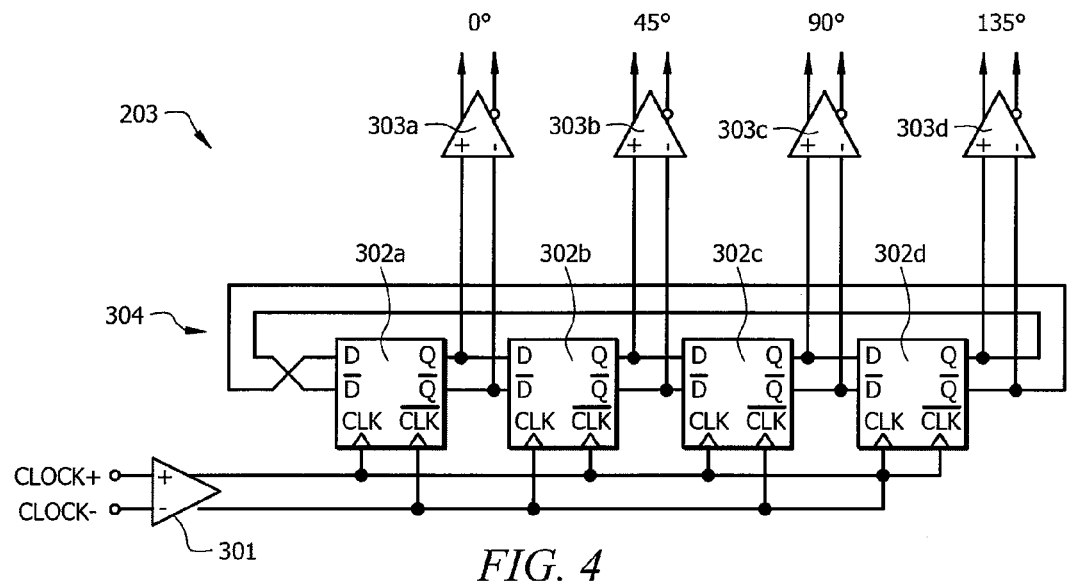
FIG. 4 is a schematic circuit diagram illustrating one embodiment of a multiphase local oscillator generator for use with embodiments of a harmonic rejection mixer.

FIG. 4 is a schematic circuit diagram illustrating one embodiment of a multiphase LOGEN 203 for use with embodiments of a harmonic rejection mixer 107. The multiphase LOGEN 203 of FIG. 4 may include a clock buffer 301. Additionally, the multiphase LOGEN 203 may include multiple D-flip-flops 302a-d arranged in a multiphase ring core 304 configuration. In an alternative embodiment, the D-flip-flops 302a-d may be replaced with D-latches. Clock buffer 301 may be coupled to clock input port of each of the D-flip-flops 302a-d. Additionally, each of the D-flip-flops 302a-d may be coupled to an output buffer 303a-d.

In certain embodiments, the transistors in the D-flip-flops 302 may operate with relatively small headroom voltages, and statistical degradation of the phase accuracy of the signals from these components may be difficult to avoid at high frequencies (e.g., fclock/4 as high as 1 GHz), using high frequency transistors in a 0.13-μm process with a 1.5-V voltage source. Thus, the clock buffer 301 may facilitate control of the clock signal levels.

In an embodiment, the amplitude of the LO signals applied to the passive mixing cell 204 is approximately 1 V referenced to a bias voltage VMIXbias that may also be approximately 1 V. Because of the relatively low voltage source in typical multiphase ring core 304 and passive mixers 204, the multiphase ring core 304 may only reach amplitudes of 0.2 V-0.3 V independently. Thus, the output buffers 303a-d may be used to increase the output voltage of the multiphase LOGEN 203 to higher potential levels, such as 1 V-2 V. The details of the clock buffer 301 and the output buffers 303a-d are described further with relation to FIGS. 6-12 below. Although the output buffers 303a-d may facilitate increasing the output signals to desired amplitude levels, they may also introduce interfering capacitances and other signal-degrading factors into the system. In particular, capacitance on the line coupling the output buffers 303a-d to the D-flip-flops 302a-d may affect signal integrity.

Figure 5:
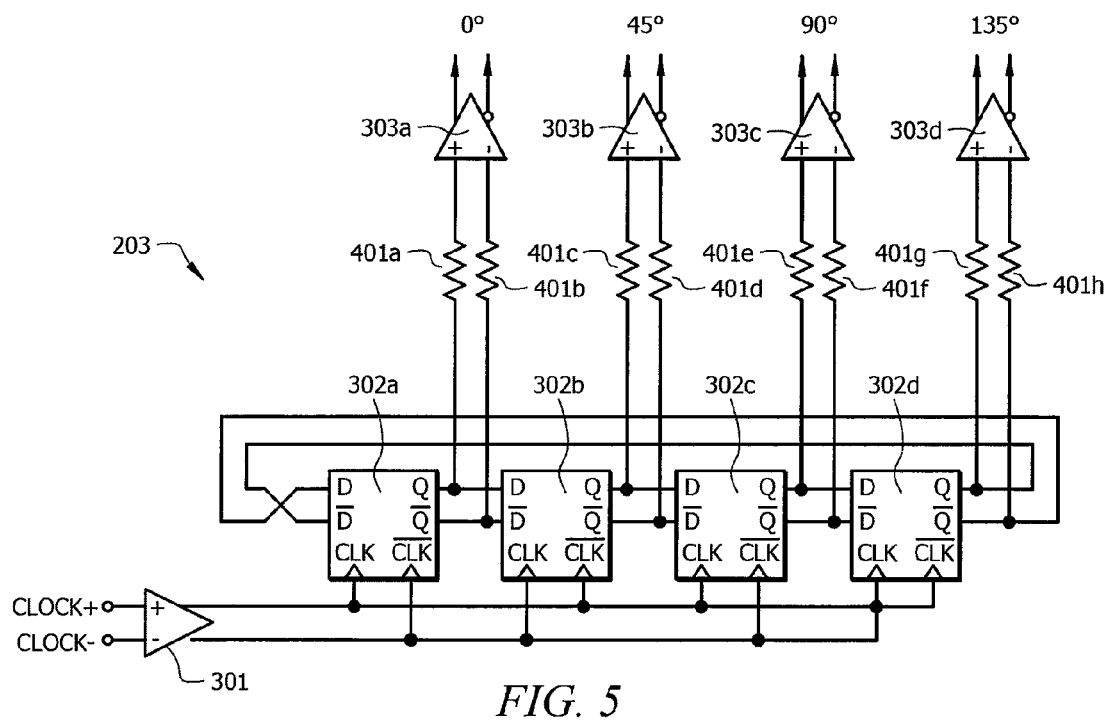
FIG. 5 is a schematic circuit diagram illustrating another embodiment of a multiphase local oscillator generator for use with embodiments of a harmonic rejection mixer.

FIG. 5 is a schematic circuit diagram illustrating another embodiment of a multiphase LOGEN 203 for use with embodiments of a harmonic rejection mixer 107 that may reduce signal degradation due to introduction of the output buffers 303a-d. In particular, the embodiment of FIG. 5 includes one or more isolation resistors (RISO1-8) 401a-h which may isolate the D-flip-flops 302a-d from parasitic capacitance on the line coupling the output of the D-flip-flops 302a-d to the output buffers 303a-d. In one embodiment, the isolation resistors 401a-h may each be physically positioned as close as practical to the output of each respective D-flip-flop 302a-d, thus maximizing the isolation effect. In one embodiment, the isolation resistors 401a-h may have a relatively high resistance, for example 1 k-2 k.

Figure 6:
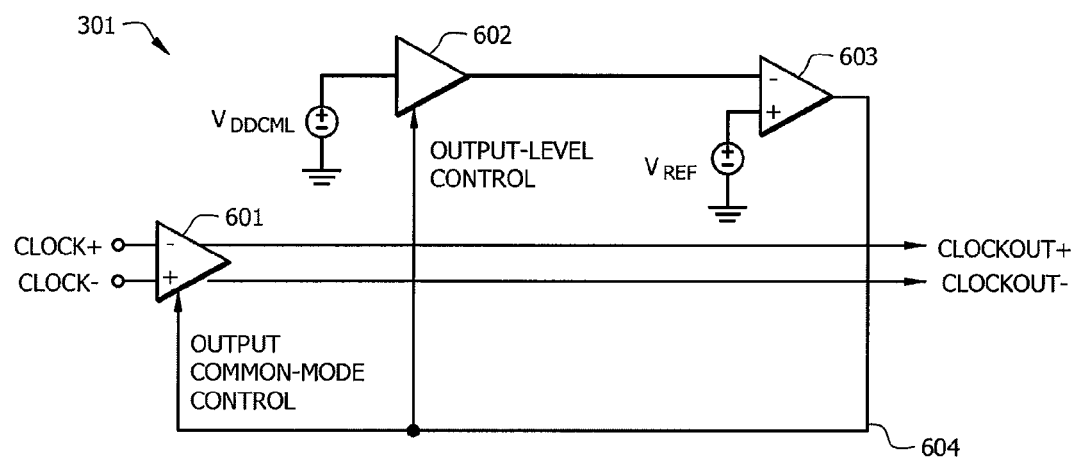
FIG. 6 is a schematic block diagram illustrating one embodiment of a clock buffer for use with embodiments of a harmonic rejection mixer.

FIG. 6 is a schematic block diagram illustrating one embodiment of an clock buffer 301 for use with embodiments of a harmonic rejection mixer 107. In the embodiment of FIG. 6, the clock buffer 301 is arranged in a feedback configuration. In one embodiment, the clock buffer 301 comprises an input amplifier 601 configured to accept input clock signals. The input amplifier 601 may also receive a control signal configured to adjust the common mode voltage of the output signals to levels within tolerances for proper input levels to the flip-flops 302a-d. In such an embodiment, the clock buffer may resolve headroom issues that might otherwise be experienced in the flip-flops 302a-d. In a particular embodiment, the input amplifier 601 may be a high-speed amplifier.

Additionally, the clock buffer 301 may include a DC replica amplifier 602 configured to generate a DC voltage at its output, which may is applied to the inverting input of a servo amplifier 603. In one embodiment, the servo amplifier 603 may have a relatively high gain. In such an embodiment, both the clock buffer 601 and the replica amplifier 602 may receive control signals from the output of the servo amplifier 603. The control signals may control the output common-mode voltage level of input amplifier 601 and the output level of replica amplifier 602. In this feedback configuration, the output of the servo amplifier 603 will cause the replica amplifier 602 to maintain a relatively constant voltage level relative to input voltage VREF. Accordingly, the feedback configuration also allows servo amplifier 603 to provide a consistent control signal to the input amplifier 601. Having a clock signal with a constant common-mode voltage driving the flip-flops 302a-d simultaneously helps to maintain a proper clock amplitude and a correct bias level for bias transistors in the D-flip-flops 302a-d. Accordingly, phase errors in multiphase LO outputs of the flip-flops 302a-d may be reduced.

Figure 7:
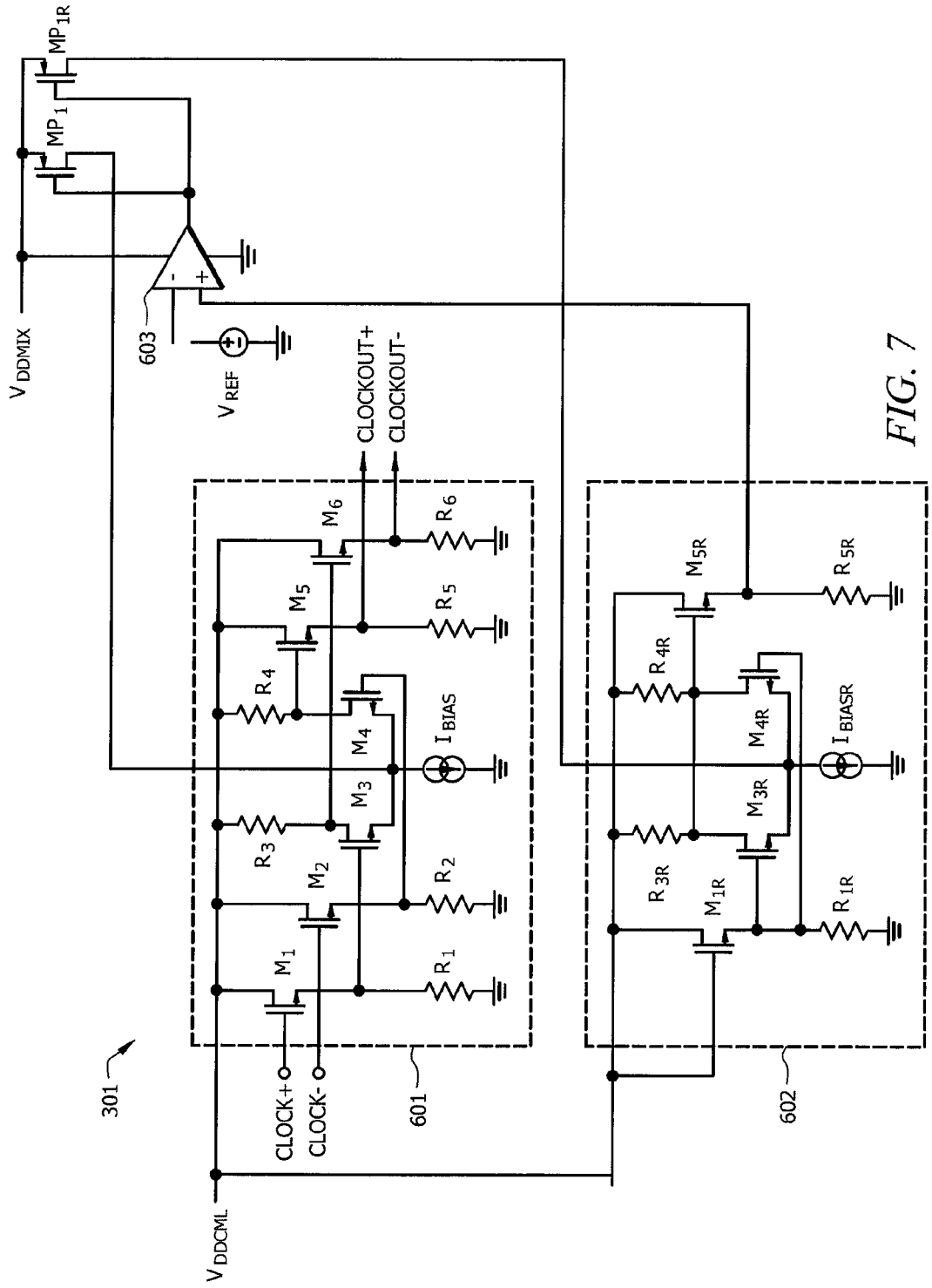
FIG. 7 is a schematic circuit diagram illustrating another embodiment of a clock buffer for use with embodiments of a harmonic rejection mixer.

FIG. 7 is a schematic circuit diagram illustrating another embodiment of a clock buffer 301 for use with embodiments of a harmonic rejection mixer 107. Embodiments of an input amplifier 601 and a replica amplifier 602 are described in greater detail, showing one embodiment of a circuit configuration within each amplifier 601,602 respectively. In this embodiment, the output from the replica amplifier 602 is coupled to the noninverted input to the servo amplifier 603. Additionally, feedback from the servo amplifier 603 is provided to both the input amplifier 601 and the replica amplifier 602 via transistors MP1 and MP1R respectively.

In one embodiment, input amplifier 601 includes identical transistors in a source-follower configuration M1 and M2 biased by identical resistors R1 and R2. The output signals of source followers M1 and M2 are then applied to differential pair M3-M4 (M3 and M4 may be identical) biased by current IBIAS, and are amplified across identical load resistors R3 and R4. The output signal of the differential pair is then applied to identical output source followers M5 and M6 biased by identical resistors R5 and R6, respectively. Replica amplifier 602 may be a scaled DC replica of input amplifier 601 (where only one of the input source followers of input amplifier 601, and one output source followers are replicated in replica amplifier 602 for saving supply current).

Figure 8:
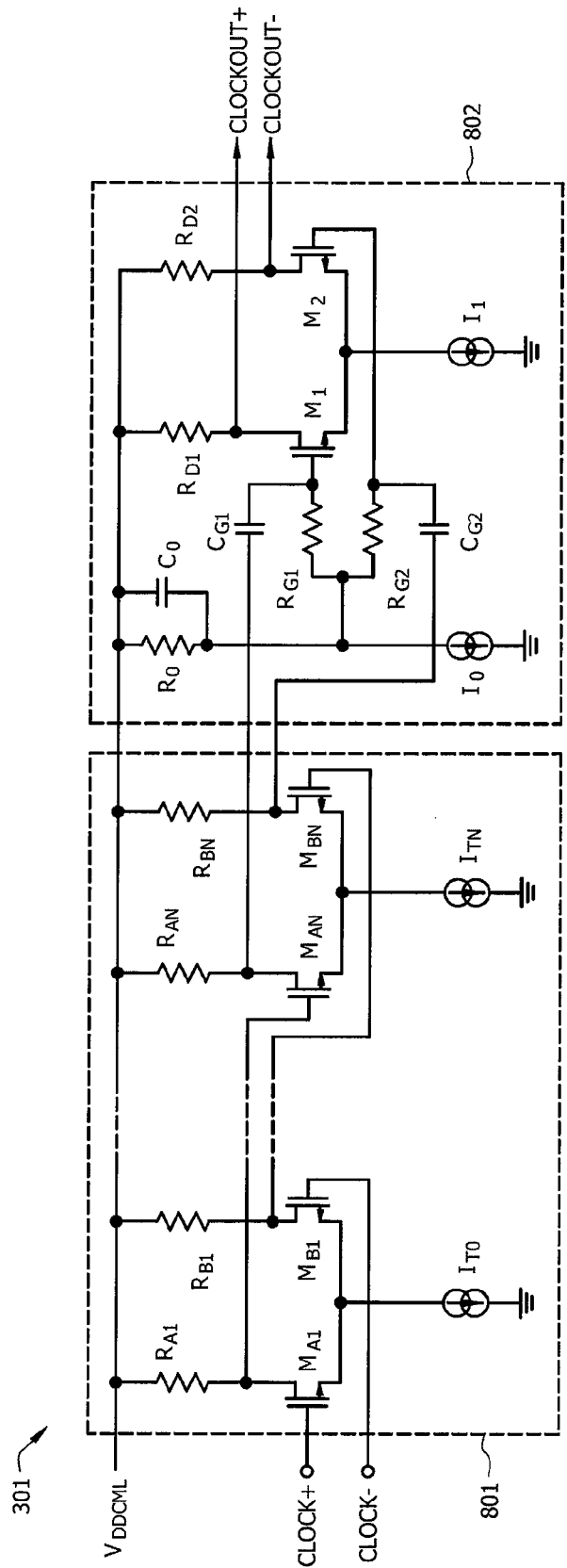
FIG. 8 is a schematic circuit diagram illustrating another embodiment of a clock buffer for use with embodiments of a harmonic rejection mixer.

FIG. 8 is a schematic circuit diagram illustrating another embodiment of a clock buffer 301 for use with embodiments of a harmonic rejection mixer 107. In this embodiment, the clock signal coming from a plurality of signal pairs may coupled to a cascade of differential transistor pairs MA1, MB1 through MAN, MBN. The differential transistor pairs may be coupled to load resistors RA1, RB1 through RAN, RBN and bias current sources IT1-ITN. For example, the non-inverted and inverted leads of the clock input may be coupled to transistors MA1 and MA2 respectively. The first differential pair may then be coupled to the second differential pair, and so on until the last differential pair is coupled in a cascaded configuration.

The driver 801 is then coupled to the output stage 802. In one embodiment, the driver 801 may be AC-coupled to the output stage 802 by coupling transistors MAN and MBN in the driver 801 to transistors M1 and M2 in the output stage 802 respectively. The AC coupling between the driver 802 and the output stage 804 preserves the intrinsic phase accuracy of the flip-flops 302 in the ring core 304 by ensuring that any DC offset generated in the driver is not amplified in the output stage and then applied to flip-flops 302a-d. In certain embodiments, the value N may be small. For example there may only be two or three sets of differential pairs in the driver 801 because this number may be sufficient to provide large enough signals at the output of the buffer 301.

The input buffers 301 of FIGS. 6-8 provide input signals to the flip-flops 302a-d that may be suitable for generating a multiphase output having a high frequency. In addition, the output of the flip-flops 302a-d may be buffered by output buffers 303a-d to generate multiphase outputs of suitable signal power levels for use by other system components, such as passive mixers 204a-d.

Figure 9:
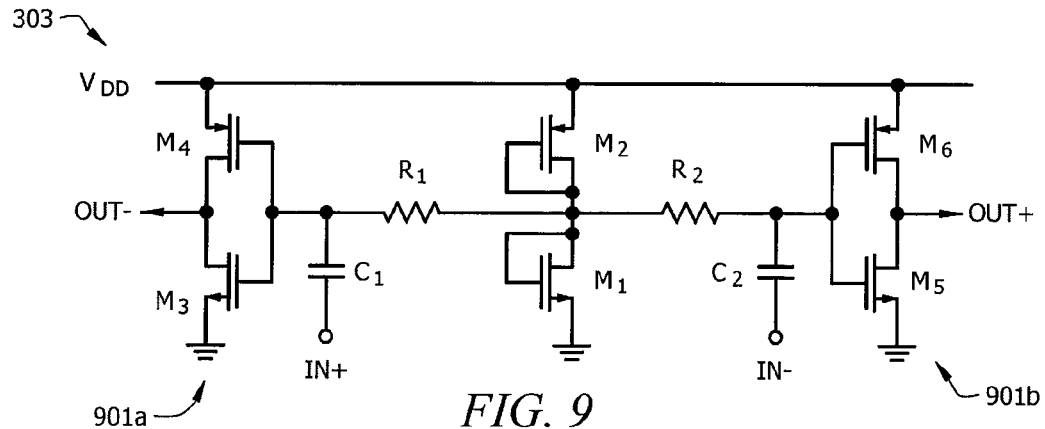
FIG. 9 is a schematic circuit diagram illustrating one embodiment of an open-loop output buffer for use with embodiments of a harmonic rejection mixer.

FIG. 9 is a schematic circuit diagram illustrating one embodiment of an open-loop output buffer 303 for use with embodiments of a harmonic rejection mixer 107. As illustrated, the output buffer 303 may be implemented in CMOS technology. The output buffer 303 may include one or more CMOS inverters 901. As depicted, FIG. 9 includes two CMOS inverters 901a-b separated by two resistors R1 and R2 and two transistors M1 and M2. The resistance values of R1 and R2 may be relatively high to ensure that the output buffer 301 has a high input impedance. In a particular embodiment, the values of R1 and R2 may be approximately 100 k. In such an embodiment, the voltage at nodes A-E may be approximately VDD/2. In such an embodiment, the output buffer 303 may generate output signals having sharp edges relative to signals that would be produced by a typical buffer having a feedback configuration. An additional benefit is that the open-loop configuration consumes less power than typical feedback buffer configurations.

Figure 10:
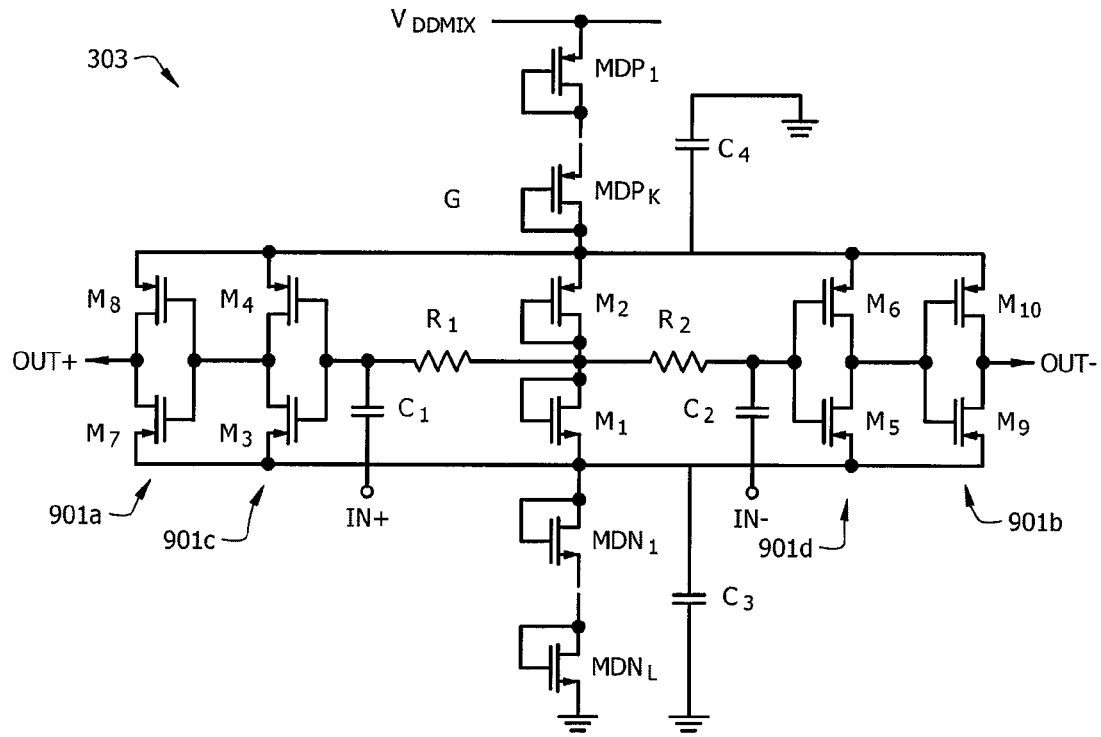
FIG. 10 is a schematic circuit diagram illustrating one embodiment of a configurable open-loop output buffer for use with embodiments of a harmonic rejection mixer.

FIG. 10 is a schematic circuit diagram illustrating one embodiment of a configurable open-loop output buffer 303 for use with embodiments of a harmonic rejection mixer 107. In particular, this embodiment, may include two additional inverters 901c-d coupled in a cascaded arrangement with inverters 901a-b respectively and configured to provide sharper edges on the output signals. Additionally, this embodiment may be a level-shifted version of the buffer described in FIG. 9.

To accomplish level shifting, diodes or PMOS diode-connected transistors MDP1-MDPK as well as NMOS diode-connected transistors MDN1-MDNL may be configured to translate the voltage supplied to the inverters to various supply levels. By changing the number of either the NMOS or PMOS diodes, an appropriate signal level may be obtained. Thus, the common mode output levels may be tuned up and down according to the number of diode-connected transistors used.

Figure 11:
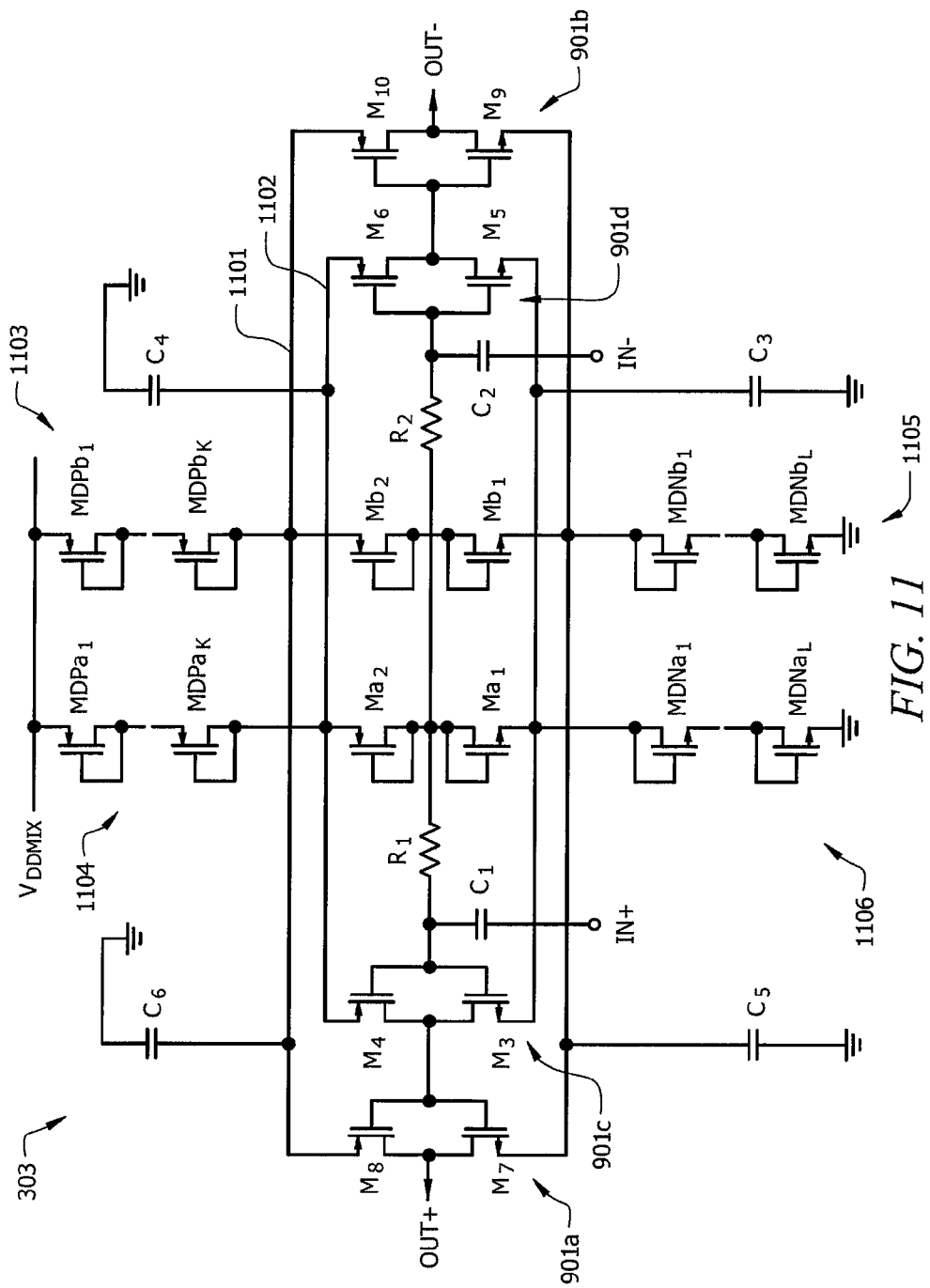
FIG. 11 is a schematic circuit diagram illustrating one embodiment of a dual-rail configurable open-loop output buffer for use with embodiments of a harmonic rejection mixer.

FIG. 11 is a schematic circuit diagram illustrating one embodiment of a dual-rail configurable open-loop output buffer 303 for use with embodiments of a harmonic rejection mixer 107. In this embodiment, inverters 901a and 901b are coupled to a first power supply rail 1101, and inverters 901c and 901d are coupled to a second power supply rail 1102. The first power supply rail 1101 is coupled to a first set of PMOS diode-connected transistors 1103 and a first set of NMOS diode-connected transistors 1105. The second power supply rail 1102 is coupled to a second set of PMOS diode-connected transistors 1104 and a second set of NMOS diode-connected transistors 1106. Thus, the power supply rail 1101 for the first set of inverters 901a and 901b may be decoupled physically as shown in FIG. 11. In one embodiment, separating the first power supply rail 1101 from the second power supply rail 1102 as shown in FIG. 11 may reduce the effects of voltage ripple occurring on the rails 1101-1102 due to the switching of the transistors in the buffer 303. It is beneficial to reduce or eliminate the effects of such voltage ripple, because under ordinary circumstances, such voltage ripple may cause phasing errors of the output signals.

Figure 12:
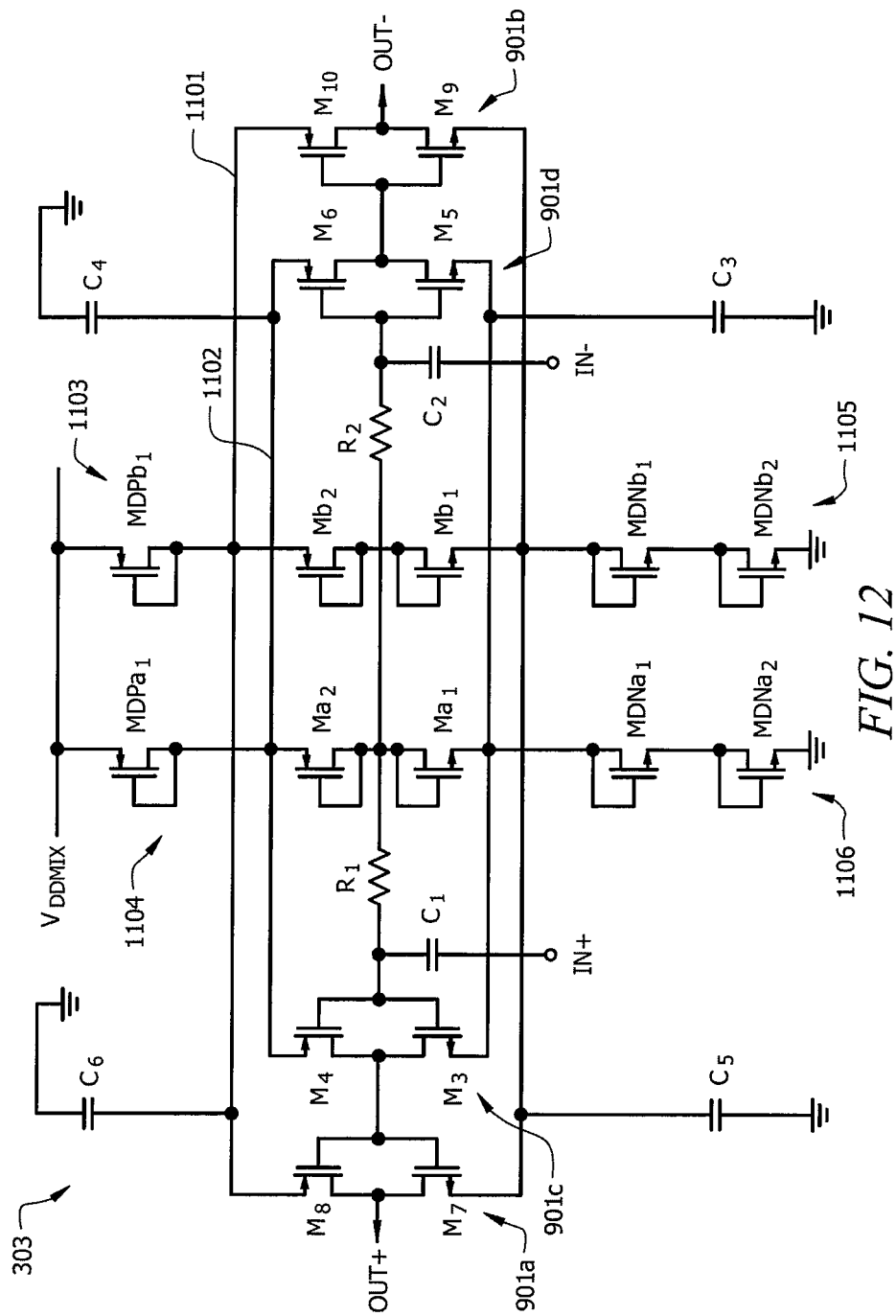
FIG. 12 is a schematic circuit diagram illustrating one embodiment of a dual-rail fixed-level open-loop output buffer for use with embodiments of a harmonic rejection mixer.

FIG. 12 is a schematic circuit diagram illustrating one embodiment of a dual-rail fixed-level open-loop output buffer 303 for use with embodiments of a harmonic rejection mixer 107. In particular, in the embodiment of FIG. 12, one set of PMOS diode-connected transistors is selected and two sets of NMOS diode-connected transistors are selected for each rail. In a particular embodiment, the ratio in numbers and also the sizes of the diode-connected transistors may be selected to produce a 0.8 V rail voltage on the first rail 1101 and 2.1 V on the second rail 1102.

Figure 13:
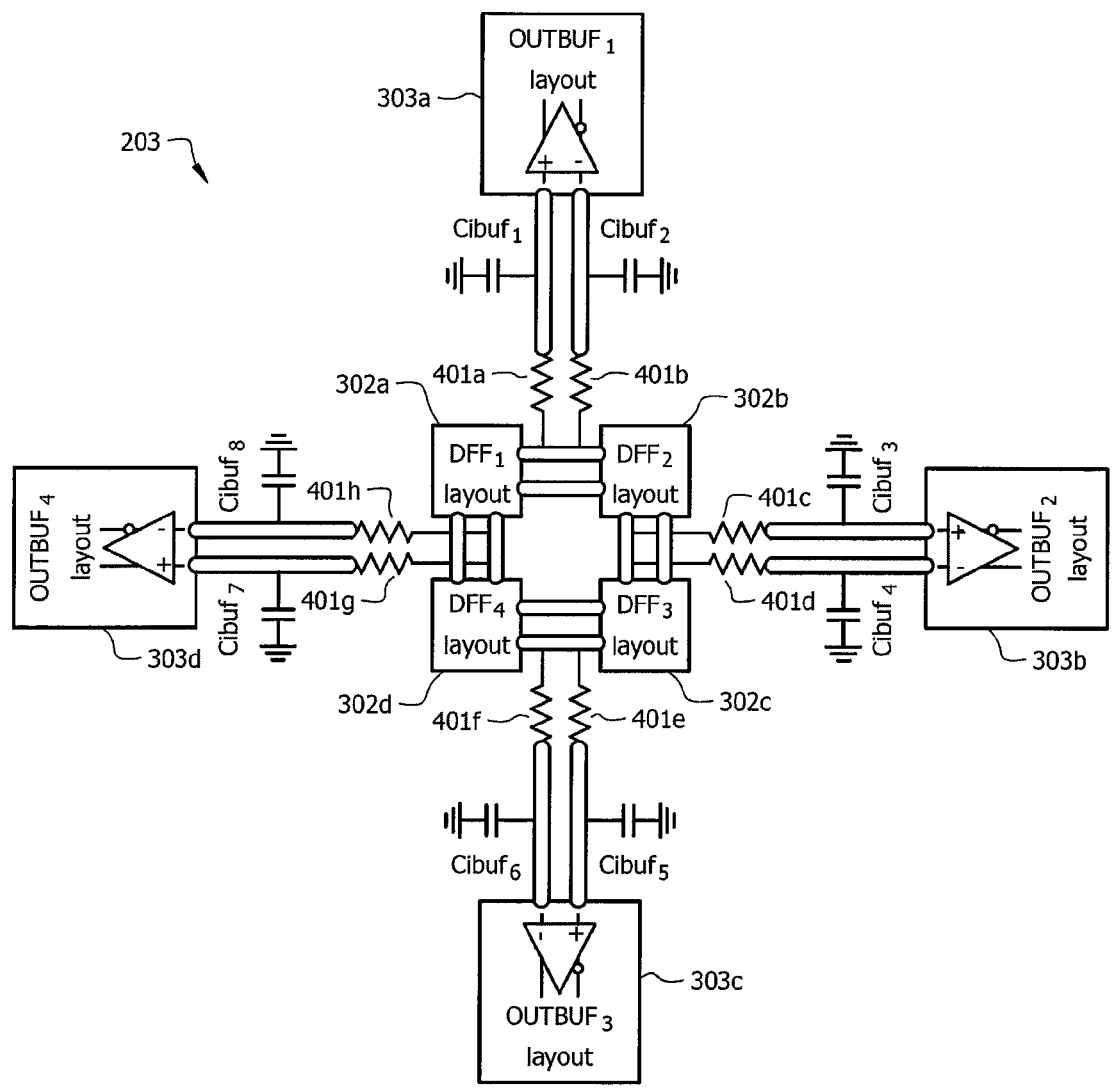
FIG. 13 is a schematic layout diagram illustrating a circuit layout for one embodiment of a local oscillator generator.

FIG. 13 is a schematic layout diagram illustrating a circuit layout for one embodiment of a LOGEN 203 for use with a harmonic rejection mixer 107. As illustrated in the embodiment of FIG. 13, each of the flip-flops 302a-d may be placed in close physical proximity to the other flip-flops 302a-d so as to reduce the connection line length between the flip-flops 302a-d. Additionally, the flip-flops 302a-d are arranged in a ring configuration. Similarly, the isolation resistors 401a-h are also positioned in close proximity to the flip-flops 302a-d on the lines coupling the flip-flops 401a-d to the output buffers 303a-d, so as to maximize isolation of the flip-flops 302a-d from parasitic capacitance of the lines.

Figure 14:
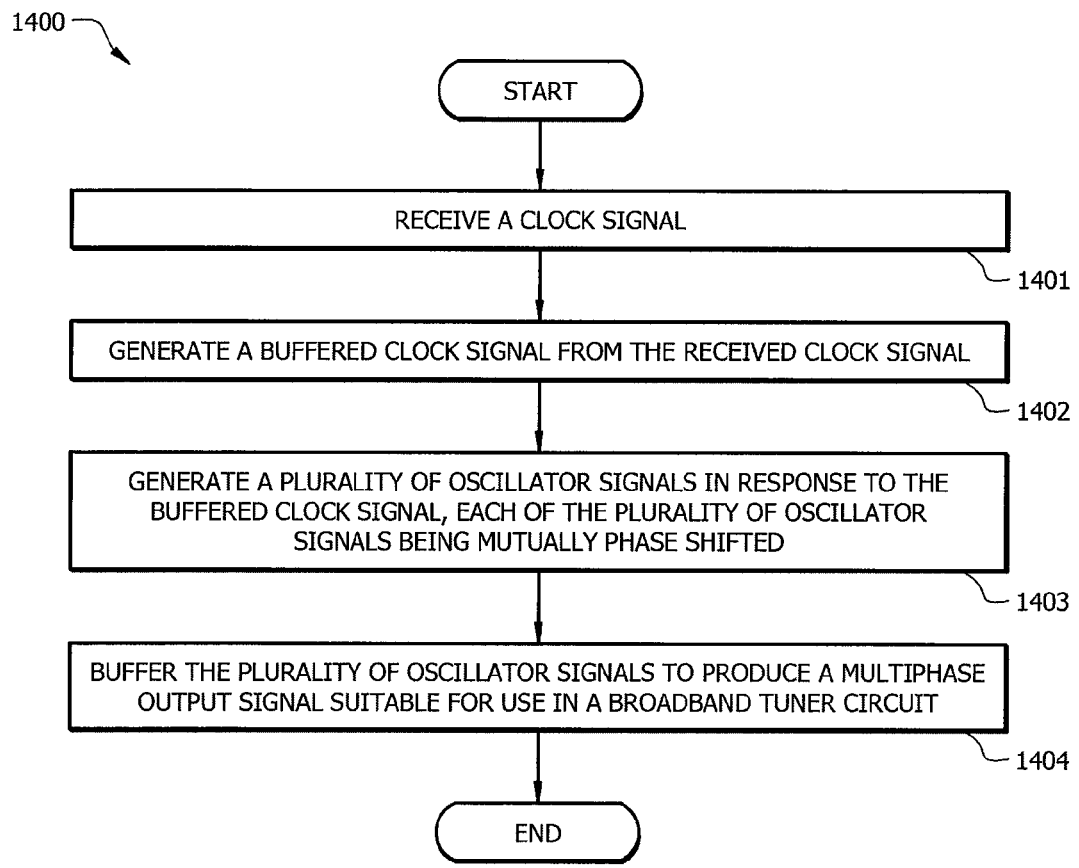
FIG. 14 illustrates one embodiment of a method for providing multiphase local oscillator signals in a broadband tuner.

FIG. 14 illustrates one embodiment of a method 1400 for providing multiphase local oscillator signals in a broadband tuner 100. In one embodiment, the method 1400 starts when an input buffer 301 receives 1401 a clock signal from a remote clock source, such as PLL 108. The input buffer 301 may then generate 1402 a buffered clock signal from the received clock signal. A multiphase oscillator core may then generate 1403 a plurality of oscillator signals in response to the buffered clock signal, each of the plurality of oscillator signals being mutually phase shifted. In one embodiment, the multiphase oscillator core may comprise a plurality of flip-flop devices 302a-d arranged in a ring configuration as illustrated in FIG. 13. One or more output buffers 303a-d may then buffer 1404 the plurality of oscillator signals to produce a multiphase output signal suitable for use in a broadband tuner 100.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
a clock buffer configured to buffer a received clock signal and generate a buffered clock signal;
a multiphase local oscillator core coupled to the clock buffer and configured to generate a plurality of oscillator signals in response to the buffered clock signal, each of the plurality of oscillator signals being mutually phase shifted; and
a plurality of output buffers, each configured to receive one of the plurality of oscillator signals and to produce an output signal suitable for use in a broadband tuner circuit in response to the one of the plurality of oscillator signals,
wherein at least one of:
the clock buffer is configured to reduce spurious and harmonic anomalies in the received clock signal;
the clock buffer is configured to generate a clock signal output having a stable common-mode voltage;
the clock buffer comprises a feedback control mechanism for regulating a common-mode voltage level of the clock buffer output with a reference voltage source; or
the clock buffer comprises:
a driver stage having a plurality of AC-coupled differential transistor pairs; and
an output stage AC-coupled to the driver stage, wherein the output stage is configured to generate the buffered clock signal without introducing DC offsets.

2. An integrated circuit comprising:
a clock buffer configured to buffer a received clock signal and generate a buffered clock signal;
a multiphase local oscillator core coupled to the clock buffer and configured to generate a plurality of oscillator signals in response to the buffered clock signal, each of the plurality of oscillator signals being mutually phase shifted; and
a plurality of output buffers, each configured to receive one of the plurality of oscillator signals and to produce an output signal suitable for use in a broadband tuner circuit in response to the one of the plurality of oscillator signals,
wherein the multiphase local oscillator core comprises a plurality of flip-flop devices arranged in a ring configuration.

3. The integrated circuit of claim 2, further comprising a plurality of isolation resistors, each isolation resistor being coupled between one of the plurality of flip-flop devices and one of the plurality of output buffers.

4. The integrated circuit of claim 3, wherein each of the plurality of isolation resistors is physically positioned closer in proximity to one of the plurality of flip-flops than to one of the plurality of output buffers along a signal conducting line between the one of the plurality of flip-flops and the one of the plurality of output buffers.

5. The integrated circuit of claim 4, wherein each of the plurality of isolation resistors is positioned adjacent to an output port of one of the flip-flops.

6. The integrated circuit of claim 4, wherein each of the plurality of isolation resistors is configured to isolate one of the plurality of flip-flops from parasitic capacitance on the signal-conducting line between each of the plurality of flip-flops and a corresponding one of the plurality of output buffers.

7. An integrated circuit comprising:
a clock buffer configured to buffer a received clock signal and generate a buffered clock signal;
a multiphase local oscillator core coupled to the clock buffer and configured to generate a plurality of oscillator signals in response to the buffered clock signal, each of the plurality of oscillator signals being mutually phase shifted; and
a plurality of output buffers, each configured to receive one of the plurality of oscillator signals and to produce an output signal suitable for use in a broadband tuner circuit in response to the one of the plurality of oscillator signals,
wherein at least one of:
each of the plurality of output buffers comprises an open-loop circuit;
each of the plurality of output buffers comprises a plurality of diode-connected transistors arranged to provide control of supply voltages used to generate the output signal; or
each of the plurality of output buffers comprises a plurality of inverters arranged to buffer a differential clock signal.

8. The integrated circuit of claim 7, wherein each of the plurality of output buffers comprises a plurality of power supply rails, each power supply rail configured to supply a prescribed voltage to at least one pair of inverters arranged to buffer a differential clock signal.

9. A broadband tuner chip comprising:
a harmonic rejection mixer having a multiphase local oscillator generator configured to generate a plurality of phase shifted clock signals in response to a single input clock signal received from a clock source, wherein the multiphase local oscillator generator is configured to operate at high frequencies and avoid phase errors through use of an input clock buffer coupled to a multiphase local oscillator core, the multiphase local oscillator core being coupled to an output buffer,
wherein the multiphase local oscillator core comprises a plurality of flip-flop devices arranged in a ring configuration, the output of each of the flip-flop devices being coupled to an input of an output buffer.

10. A broadband tuner chip comprising:
a harmonic rejection mixer having a multiphase local oscillator generator configured to generate a plurality of phase shifted clock signals in response to a single input clock signal received from a clock source, wherein the multiphase local oscillator generator is configured to operate at high frequencies and avoid phase errors through use of an input clock buffer coupled to a multiphase local oscillator core, the multiphase local oscillator core being coupled to an output buffer; and
a plurality of isolation resistors, each isolation resistor being coupled between one of the plurality of flip-flop devices and one of the plurality of output buffers.

11. The broadband tuner of claim 10, wherein each of the plurality of isolation resistors is physically positioned closer in proximity to one of the plurality of flip-flops than to one of the plurality of output buffers along a signal conducting line between the one of the plurality of flip-flops and the one of the plurality of output buffers.

12. A broadband tuner chip comprising:
a harmonic rejection mixer having a multiphase local oscillator generator configured to generate a plurality of phase shifted clock signals in response to a single input clock signal received from a clock source, wherein the multiphase local oscillator generator is configured to operate at high frequencies and avoid phase errors through use of an input clock buffer coupled to a multiphase local oscillator core, the multiphase local oscillator core being coupled to an output buffer, wherein the output buffer comprises a plurality of inverter circuits arranged in an open-loop configuration, and having a plurality of diode-connected transistors coupled to a voltage supply rail for controlling a voltage level supplied to the plurality of inverters.

* * * * *